United States Patent
Conte et al.

(10) Patent No.: US 9,697,896 B2
(45) Date of Patent: Jul. 4, 2017

(54) HIGH THROUGHPUT PROGRAMMING SYSTEM AND METHOD FOR A PHASE CHANGE NON-VOLATILE MEMORY DEVICE

(71) Applicants: STMICROELECTRONICS S.r.l., Agrate Brianza (IT); STMICROELECTRONICS PTE LTD, Singapore (SG)

(72) Inventors: Antonino Conte, Tremestiere Etneo (IT); Alberto Jose' Di Martino, Palagonia (IT); Kailash Khairnar, Leixlip (IE)

(73) Assignees: STMICROELECTRONICS S.R.L., Agrate Brianza (MB) (IT); STMICROELECTRONICS PTE LTD., Singapore (SG)

( * ) Notice: Subject to any disclaimer, the term of this patent is extended or adjusted under 35 U.S.C. 154(b) by 194 days.

(21) Appl. No.: 14/623,300

(22) Filed: Feb. 16, 2015

(65) Prior Publication Data
US 2015/0243356 A1    Aug. 27, 2015

(30) Foreign Application Priority Data
Feb. 26, 2014    (IT) .............................. TO2014A0158

(51) Int. Cl.
*G11C 13/00* (2006.01)
*G11C 8/04* (2006.01)

(52) U.S. Cl.
CPC ............ *G11C 13/0069* (2013.01); *G11C 8/04* (2013.01); *G11C 13/0004* (2013.01); *G11C 13/0023* (2013.01); *G11C 13/0026* (2013.01); *G11C 13/0061* (2013.01); *G11C 13/0097* (2013.01); *G11C 2213/79* (2013.01)

(58) Field of Classification Search
CPC .................................... G11C 13/0069
USPC .............................. 365/148, 189.16, 233.18
See application file for complete search history.

(56) References Cited

U.S. PATENT DOCUMENTS

| | | | |
|---|---|---|---|
| 9,123,411 B2 * | 9/2015 | Murooka | G11C 13/0033 |
| 2005/0052904 A1 | 3/2005 | Cho | |
| 2011/0055351 A1 * | 3/2011 | Boldyrev | H04B 5/0031 709/219 |
| 2012/0224410 A1 | 9/2012 | Yan | |
| 2013/0258766 A1 | 10/2013 | Conte | |
| 2015/0103581 A1 * | 4/2015 | Murooka | G11C 13/0033 365/148 |

* cited by examiner

*Primary Examiner* — Hoai V Ho
*Assistant Examiner* — Jay Radke
(74) *Attorney, Agent, or Firm* — Slater Matsil, LLP (57) ABSTRACT

A phase change non-volatile memory device has a memory array with a plurality of memory cells arranged in rows and columns, a column decoder and a row decoder designed to select columns, and, respectively, rows of the memory array during operations of programming of corresponding memory cells. A control logic, coupled to the column decoder and the row decoder, is designed to execute a sequential programming command, to control the column decoder and row decoder to select one column of the memory array and execute sequential programming operations on a desired block of memory cells belonging to contiguous selected rows of the selected column.

26 Claims, 5 Drawing Sheets

HIGH THROUGHPUT PROGRAMMING SYSTEM AND METHOD FOR A PHASE CHANGE NON-VOLATILE MEMORY DEVICE

FIELD OF THE INVENTION

The present invention relates to a high throughput programming system and method for a phase change non-volatile memory device.

BACKGROUND

As it is known, phase change memories, the so-called ePCMs (embedded Phase Change Memories) are a new generation of integrated non-volatile memories, in which, to store information, the characteristics of materials having the property of switching between phases having different electrical characteristics are exploited. These materials may switch between an amorphous, disorderly, phase and a crystalline or polycrystalline, orderly, phase and resistivities of considerably different value, and consequently a different value of a datum stored, are associated with the two phases. For example, the elements of the VI group of the periodic table, such as tellurium (Te), selenium (Se), or antimony (Sb), referred to as chalcogenides or chalcogenic materials, may be advantageously used for manufacturing phase change memory cells; in particular, an alloy made up of germanium (Ge), antimony (Sb), and tellurium (Te), known as GST (having the chemical composition $Ge_2Sb_2Te_5$) is currently widely used in such memory cells.

The phase changes may be obtained by locally increasing the temperature of the cells of chalcogenic material, through resistive electrodes (generally known as heaters) set in contact with respective regions of chalcogenic material.

Access (or selection) devices (for example, MOSFETs), are connected to the heaters and selectively enable passage of a programming electric current therethrough; this electric current, by the Joule effect, generates the temperatures required for the phase change.

In particular, when the chalcogenic material is in the amorphous state, at a high resistivity (the so-called RESET state), it is required to apply a current/voltage pulse (or a suitable number of current/voltage pulses) of duration and amplitude such as to enable the chalcogenic material to cool slowly. Subjected to this treatment, the chalcogenic material changes its state and switches from the high-resistivity state to a low-resistivity state (the so-called SET state). Vice versa, when the chalcogenic material is in the SET state, it is required to apply a current/voltage pulse having suitable duration and high amplitude, so as to cause the chalcogenic material to return into the high-resistivity amorphous RESET state.

During reading, the state of the chalcogenic material is detected by applying a voltage sufficiently low as not to cause a sensible heating thereof, and then reading the value of the current that flows in the memory cell via a suitable sense amplifier. Since the current is proportional to the conductivity of the chalcogenic material, it is possible to determine in which state the material is, and consequently to determine the datum stored in the memory cell.

In general, a PCM device allows to achieve important advantages, among which are high scalability and reading speed combined with a reduced current consumption and a high efficiency. As shown schematically in FIG. 1, a non-volatile PCM device, designated by 1, generally comprises a memory array 2 made up of a plurality of memory cells 3, arranged in rows or wordlines, WL, and bitlines, BL.

Figure 1:
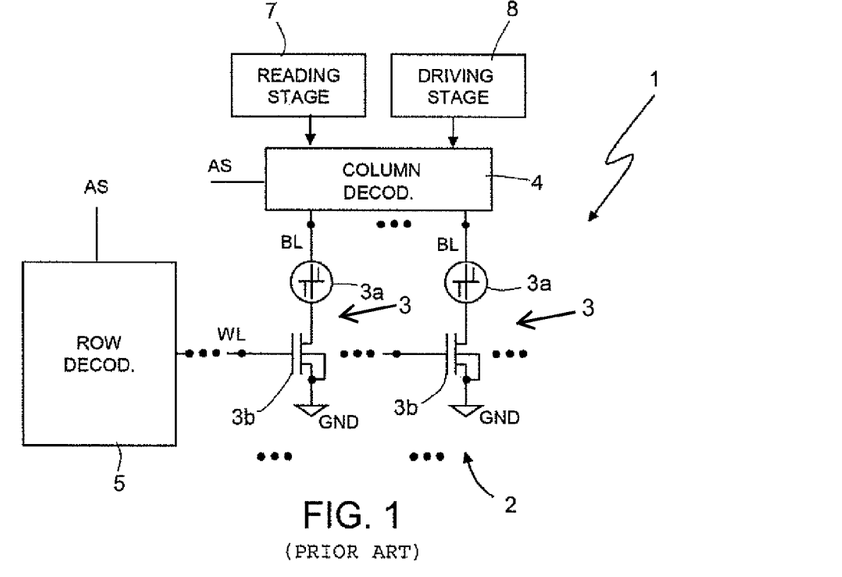
FIG. 1 is a general block diagram of a non-volatile PCM device of a known type.

Each memory cell 3 is constituted by a storage element 3a and by an access element 3b, which are connected in series between a respective bitline BL and a terminal at reference potential (for example, ground, GND). A wordline WL is defined by the set of all the control terminals of the access elements 3b aligned along one and the same row.

The storage element 3a includes a phase change material element (for example, a chalcogenide, such as GST), and is consequently able to store data in the form of resistance levels associated with the different phases assumed by the same material (for this reason, in the attached figures it will at times be modeled as a resistor with variable resistance). The access element 3b, as in the embodiment illustrated, is an N-channel CMOS transistor having its gate terminal connected to a respective wordline WL, its drain terminal connected to the storage element 3a, and its source terminal connected to the reference potential terminal. The access element 3b is controlled and biased so as to enable, when selected, the passage of a reading, or programming, current through the storage element 3a, having suitable values during respective reading or programming operations.

A column decoder 4 and a row decoder 5 enable selection of the memory cells 3, on the basis of address signals received at input (generated in a known way and designated as a whole by AS) and more or less complex decoding schemes, and in particular selection of the corresponding wordlines WL and bitlines BL, each time addressed, enabling biasing thereof at suitable voltage and current values. In particular, it is known that SET and RESET programming operations may be executed on "words" including a number $N_b$ of bits and respective memory cells 3 ($N_b$ being an integer number higher or equal to 1), i.e. on a corresponding number $N_b$ of bitlines BL in a wordline WL.

Column decoder 4 is thus designed to select for programming a "column", that is as a group of bitlines BL, in a number $N_b$ corresponding to the number of bits of the word to be programmed (bitlines EL, one per memory cell 3, are selected at the same time by the column decoder 4). In the following, the term "column" will therefore be intended to refer to a group of $N_b$ bitlines BL.

It is also known that during writing (or programming) operations, both when programming of the SET state is required and when programming of the RESET state of the chalcogenide material of the memory cells 3 is required, supplying to the storage elements 3a of high-value current pulses is needed, for activation of the mechanisms for change of state. For example, programming of the SET state may be obtained via a box or rectangular current pulse having an amplitude for example between 100 µA and 200 µA, such as 140 µA, whereas programming of the RESET state may be obtained via a box or rectangular current pulse having a higher amplitude for example between 200 µA and 700 µA, such as 300 µA.

The voltage on the bitline BL selected for programming BL may be expressed via the following relation:

$$VBL = RGST \cdot I + Vh + VDS$$

where RGST is the resistance value of the storage element 3a, I is the current circulating through it, Vh is the so called "holding voltage", having a value which is characteristic for the PCM memory cell, and VDS is the voltage drop between the drain and source terminals of the access element 3b.

Considering a value of the resistance RGST of approximately 2.5 kΩ, a value of 0.5 V for the holding voltage Vh, and a voltage drop VDS between 1 V and 1.5 V, the voltage on the bitline VBL may reach values in the region of 3 V. It follows that the voltage supplied to the column decoder 4 must be higher than this value, for example equal to 3.6 V, in order to enable the passage of the desired current during the programming step.

The column decoder 4 is moreover configured for internally providing two distinct paths towards the bitlines BL of the memory array 2 each time selected: a reading path, designed to selectively create a conductive path between each selected bitline BL and a sense-amplifier stage 7, configured to compare the current circulating in the addressed memory cell 3 with a reference current in order to determine the datum stored; and a programming path, designed to selectively create a conductive path between each selected bitline BL and a driving stage 8, configured to supply the high currents required for the programming operations of the SET and RESET states.

For this purpose, the column decoder 4 comprises, for each reading and programming path, suitable selection elements, in particular controlled transistors, connected in cascaded fashion and configured for implementing a hierarchical address decoding for selection of the memory cells 3.

Figure 2:
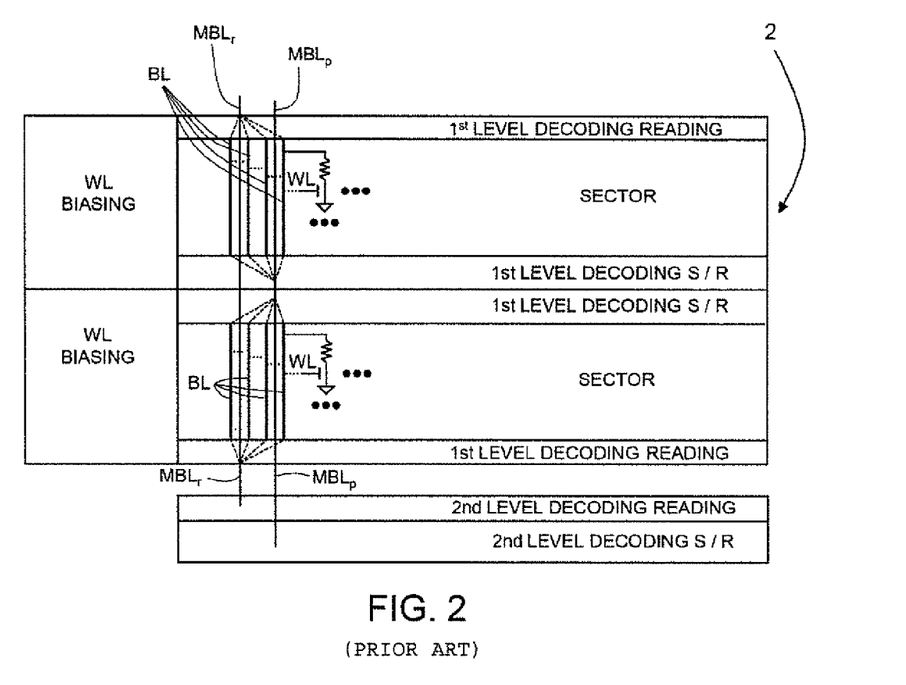
FIG. 2 is a general outline of the hierarchical structure of part of the memory device of FIG. 1 and of the corresponding decoding architecture.

In particular, as shown schematically in FIG. 2, the memory array 2 is generally arranged in a plurality of sectors, each of which comprises a plurality of memory cells 3. Each sector has a plurality of wordlines WL and respective local bitlines, designated once again by BL (distinct from those of the other sectors), which are physically connected to the memory cells 3 of the memory array 2 present in the same sector. In addition, for each set of local bitlines BL, for example four in number, two main bitlines MBL are provided, one for reading, designated by MBLr, and one for programming, designated by MBLp, designed, when selected at a higher hierarchical level, to enable subsequent selection, at a lower hierarchical level, of one or more of the respective local bitlines BL and of the corresponding memory cells 3. The main bitlines MBL traverse a number of sectors and may be selected in groups at a hierarchical decoding level still higher than the one associated with selection of the main bitlines MBL.

The column decoder 4 hence comprises: for each sector, at least one respective first-level decoding circuit for the reading operations and for the (SET and RESET) programming operations, coupled to, and operable for selecting, the respective local bitlines BL; and moreover, for each group of sectors, a respective second-level decoding circuit, once again for the reading operations and for the programming operations, coupled to, and operable for selecting, the respective main bitlines MBL (as previously highlighted, also a decoding circuit at a still higher level, for selection in groups of the main bitlines MBL, may possibly be provided).

In a known manner, the decoding circuits for the reading operations are provided with N-channel CMOS transistors, whereas the decoding circuits for the programming operations are provided with P-channel CMOS transistors.

Patent application US 2013/0258766 A1, in the name of the present Assignee, discloses a decoding architecture for a PCM device, which allows use of MOS transistors of the low-voltage type only, due to: the use of transistor protection elements, in cascode configuration; the definition of suitable conditions of dynamic biasing during memory operations, both for the wordlines WL and the bitlines BL; and a suitable timing of the same biasing conditions during successive biasing steps required in preparation for the various operations of reading and/or programming of the memory device.

In this regard, it is known, for example, that using the 90-nm CMOS technology it is possible to provide: low-voltage transistors (for example, ones using voltages ranging between 1.08 V and 1.32 V, equal to a logic voltage Vdd of the memory device 1, and able to withstand, for a short period of time, also operating voltages of slightly higher values, for example equal to 1.8 V), having a smaller thickness of the gate oxide and a smaller occupation of area; and high-voltage transistors, i.e., ones designed to withstand higher operating voltages, with a maximum value, for example, between 1.55 V and 5.5 V, i.e., of a value higher or much higher than the logic voltage Vdd, and having a large thickness of the gate oxide and high occupation of area.

Figure 3:
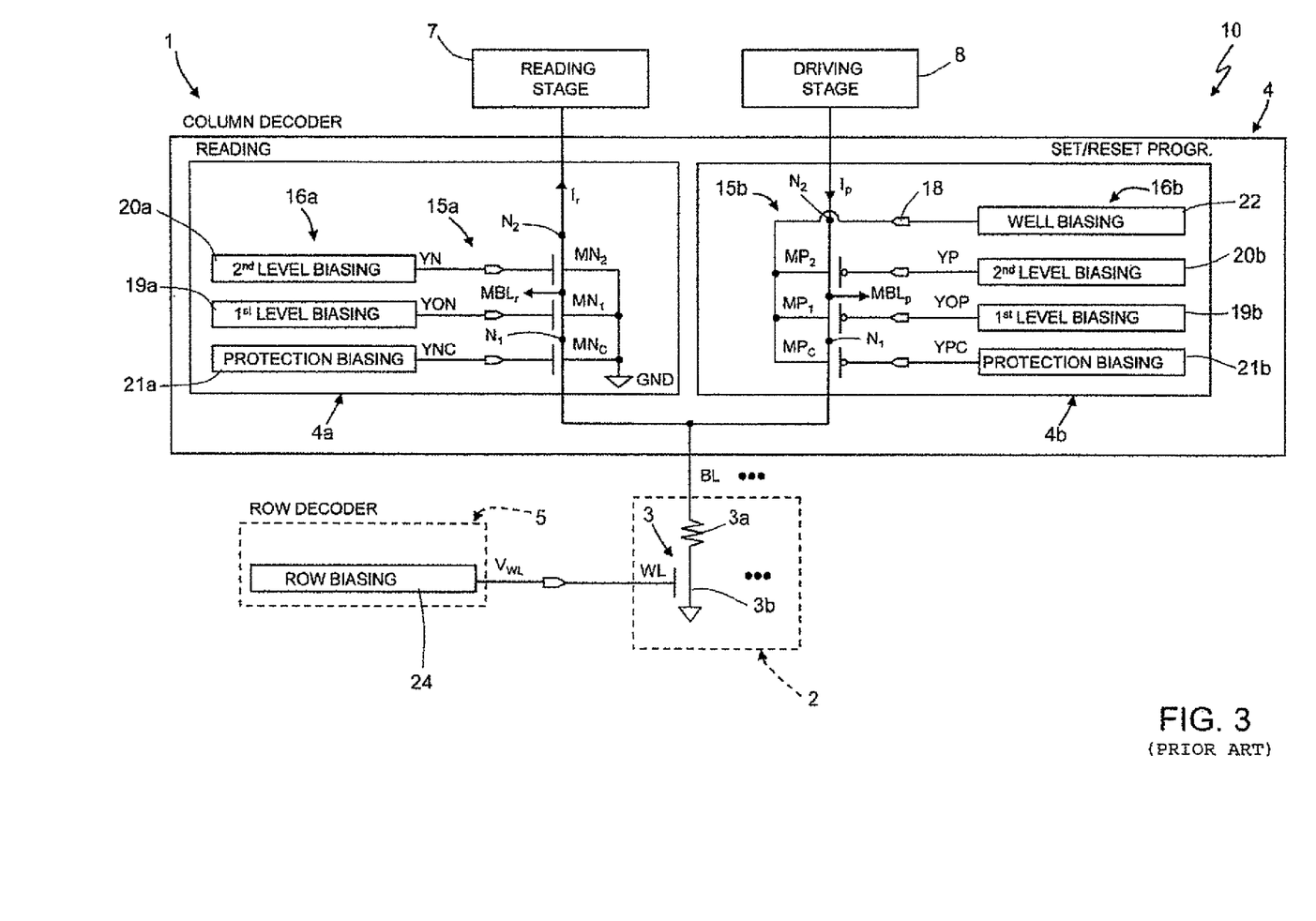
FIG. 3 is a schematic illustration of the decoding architecture for the non-volatile PCM device of FIG. 2.

In more details, and with reference to FIG. 3, this decoding architecture, designated as a whole by 10, for the memory device, designated once again by 1 (and whereof only one memory cell 3 and wordline WL of the memory array 2 is shown for sake of simplicity), comprises: a column decoder, once again designated by 4, which includes two distinct decoding paths, one for the reading operations and one for the programming operations, and in particular a reading decoding circuit 4a and a programming decoding circuit 4b; and a row decoder, once again designated by 5.

In detail, each reading and programming decoding circuit 4a, 4b of the column decoder 4 comprises:

a respective selection stage 15a, 15b; and a respective biasing stage 16a, 16b, operatively coupled to the respective selection stage 15a, 15b so as to supply the suitable biasing quantities for selection and biasing of the bitlines of the memory array 2.

Each selection stage 15a, 15b comprises: a plurality of selection switches that are hierarchically arranged on a number of decoding levels, in particular at least one first decoding level and one second decoding level, and that can be selectively operated in cascaded fashion so as to create a conductive path between the selected bitlines and a sense-amplifier stage, once again designated by 7, designed to compare the current circulating in the addressed memory cells 3 with a reference current to determine the datum stored, or, respectively, between the selected bitlines and a driving stage 8, configured to supply the high currents required for the programming operations of the SET and RESET states.

In greater detail, each selection stage 15a, 15b comprises at least:

a plurality of first-level selection switches (in FIG. 3 only one is shown, for simplicity of illustration), namely, NMOS transistors, designated by MN1, in the case of the reading decoding circuit 4a, and PMOS transistors, designated by MP1, in the case of the programming decoding circuit 4b, connected to one another in parallel and each between a respective main, or global, bitline MBL (designated once again by MBLr for the reading path and MBLp for the programming path) of the memory array 2 and a respective internal node N1, these transistors being operable for enabling selection and biasing of a respective local bitline BL and its connection to the respective main bitline MBL (according to a hierarchical decoding scheme of a known type, here not described in detail); and a plurality of second-level selection switches (in FIG. 3 once again only one is shown, for simplicity of illustration), namely, NMOS transistors, designated by MN2, in the case of the reading decoding circuit 4a, and PMOS transistors, designated by MP2, in the case of the programming decoding circuit 4b, connected to one another in parallel and each between a respective internal node N2 and a respective main bitline MBL of the memory array 2, these transistors being operable for enabling selection and biasing of the respective main bitlines MBL (according to a hierarchical decoding scheme of a known type, here consequently not described in detail).

As it is known, the number of the first-level and second-level selection switches MN1, MP1, MN2, MP2 depends on the organization and dimensions of the memory array 2 and on the corresponding division into sectors.

Moreover, in the case illustrated, the internal node N2 is directly connected to: the sense-amplifier stage 7, in the case of the reading decoding circuit 4a, for supplying thereto a reading current Ir, having a value that is a function of the datum stored in the memory cell 3 in the reading step; or the driving stage 8, in the case of the programming decoding circuit 4b, for receiving therefrom a driving current Ip, of an appropriate value (for example, 300 µA, in the case of a programming operation of a RESET state).

Alternatively, each selection stage 15a, 15b may comprise at least one further hierarchical decoding level, and in particular a plurality of third-level selection switches, which will be designated hereinafter by MN3, MP3, in analogy with what has been already described, set between the respective second internal node N2 and the sense-amplifier stage 7 or the driving stage 8.

Each selection stage 15a, 15b further comprises a plurality of protection elements, namely, NMOS transistors, designated by MNC, in the case of the reading decoding circuit 4a, and PMOS transistors, designated by MPC, in the case of the programming decoding circuit 4b, connected in cascade configuration, with respect to a respective first-level selection switch MN1, MP1, between a respective internal node N1 and a respective local bitline EL of the memory array 2. The protection elements MNC, MPC may be suitably operated for protecting the selection switches at the various decoding levels, when selected and connected in cascaded fashion. The protection elements MNC, MPC may for this purpose be biased so as to contribute to the fact that, between the conduction and control terminals of the selection switches, voltage differences never occur, higher than a maximum voltage withstandable by the low-voltage transistors for short time intervals, which are precisely those required by the programming operations (for example, having a value of 1.8 V, slightly higher than the logic voltage Vdd).

Moreover, the selection stage 15b of the biasing decoding circuit 4b comprises a well-biasing terminal 18, electrically connected to which are the well regions (having a doping of an N type) of the various PMOS transistors that constitute at least the first-level and second-level selection switches MP1, MP2 and moreover the protection elements MPC.

Each biasing stage 16a, 16b of the column decoder 4 in turn comprises:

a first-level biasing unit 19a, 19b, configured to supply suitable first-level biasing signals, designated by YON and YOP, to the control terminals of the first-level selection switches MN1, MP1 for selectively controlling closing and opening thereof;

a second-level biasing unit 20a, 20b, configured to supply suitable second-level biasing signals, designated by YN and YP, to the control terminals of the second-level selection switches MN2, MP2 for selectively controlling closing and opening thereof; and a protection biasing unit 21a, 21b, configured to supply suitable biasing signals, designated by YNC and YPC, to the control terminals of the protection elements MNC, MPC.

In addition, the biasing stage 16b of the programming decoding circuit 4b comprises a well-biasing unit 22, configured to supply suitable biasing signals to the well-biasing terminal 18.

The row decoder 5 in turn comprises a row-biasing unit 24, configured to supply appropriate biasing signals, designated by VWL, to the wordlines WL of the memory array 2, and consequently to the respective control terminals of the access elements 3b of the memory cells 3.

Based on address signals AS received at input, indicative of the bitlines and wordlines that have to be addressed for the operations of reading or programming of the corresponding memory cells 3, the biasing stages 16a, 16b of the column decoder 4 and the row-biasing unit 24 of the row decoder 5 are controlled so that they will select and supply the appropriate biasing quantities to the respective selection and access elements in order to set up the required reading and programming conductive paths towards the memory cells 3.

In particular, suitable biasing steps that are temporally consecutive and preliminary to the effective reading/programming operations are executed; these preparation steps are distinguished by respective biasing conditions.

As discussed in detail in the above patent application, these biasing conditions are designed for preventing that between the conduction and control terminals of the various low-voltage transistors in the decoding architecture 10 voltage differences occur, being higher than a maximum withstandable voltage (for example, a voltage slightly higher than the logic voltage Vdd), in any of the possible operating conditions. Given that, as highlighted previously, the use is required of high voltage values on the bitlines BL and wordlines WL during the programming operations, these biasing steps may include, for example, pre-charging of one or more internal nodes and/or one or more of the main bitlines MBL to appropriate voltage values, higher than the same maximum withstandable voltage, exploiting for this purpose the presence of the protection elements MNC, MPC and the suitable biasing of the well-biasing terminal 18 in the programming decoding circuit 4b. It is thus possible to transfer the desired high voltage and the high driving current towards the selected memory cells 3, albeit with the use of just low-voltage transistors, thanks to the appropriate timing of the biasing steps, which cause the voltage differences involved in the circuit never to be higher than a maximum voltage withstandable by the same transistors.

For example, appropriate steps of pre-charging of the voltage on the main bitlines MBLp may be included, prior to selection of the local bitlines BL, as well as steps of boosting of the voltage on the control terminals of the protection elements MPC, in cascode configuration, and on the well-biasing terminal 18.

In general, for each of the operations of reading and programming of the SET and RESET states, suitable preliminary biasing steps may be included, such as to prevent subsequent stresses and overvoltages on the low-voltage transistors used in the decoding architecture 10, and moreover direct biasing of the junctions of the same transistors. These preliminary steps may include preparation of the main bitlines MBL (and corresponding pre-charging to appropriate boosted voltage values), and subsequently effective selection and biasing of the local bitlines BL and wordlines WL for access to the memory cells 3 involved in the programming operation. In particular, precharging and programming voltages are appropriately generated by a high-voltage booster circuit (not shown) of the memory device 1, for example including one or more charge pumps, and by appropriate partitions of the boosted voltage generated by the same booster circuit.

In general, the reading operations, for which the reading decoding circuit 4a of the column decoder 4 is involved, are less critical as regards the values of the electrical quantities involved, in particular the voltage values used and the consequent stresses for the low-voltage transistors.

In fact, reading operations do not require voltage values higher than the logic voltage Vdd. The presence of the protection element MNc also in the reading decoding circuit 4a is, however, advantageous, in so far as it protects the reading path from overvoltages generated during the programming operations.

In general, Table 1 below sums up possible voltage values in the decoding architecture 10 during operations of reading and programming of the SET or RESET states; V (well N) is the voltage present on the well-biasing terminal 18.

TABLE 1

| Signal | Reading | Programming (SET/RESET) |
|---|---|---|
| V(well N) | Vdd | 3.6 V |
| YP | Vdd | 1.8 V (selected) |
|  |  | 3.6 V (not selected) |
| MBLp | Vdd | 3.6 V |
| YOP | Vdd | 1.8 V (selected) |
|  |  | 3.6 V (not selected) |
| YPC | Gnd | 1.8 V |
| BL | 0.4 V | 2.8 V |
| YNC | Vdd | 1.8 V |
| YON | Vdd | Gnd |
| MBLr | 0.4 V | Gnd |
| YN | Vdd | Gnd |
| WL | Vdd | 2.8 V |

Based also on the values shown in Table 1, it may be noted that:

the use of boosted voltages may be required only during the operations of programming of the SET and RESET states (not during reading, where the voltages required do not exceed the logic voltage Vdd);

the first-level and second-level biasing units 19a, 20a of the reading decoding circuit 4a hence may not be critical aspects in design, and may include inverters of a traditional type capable of switching at output between the values Gnd and Vdd;

the first-level and second-level biasing units 19b, 20b of the programming decoding circuit 4b may require, instead, a specific design in order to supply at output four different voltage levels, namely: 0 V (Gnd), the logic voltage Vdd; the first pre-charging voltage Vpre1, in the example illustrated equal to 1.8 V; and the programming voltage Vp, in the example illustrated equal to 3.6 V;

likewise, the row-biasing unit 24 may be designed for supplying at output three different voltage levels, namely: 0 V (Gnd); the logic voltage Vdd; and the row-selection voltage Vrow, in the example illustrated equal to 2.8 V.

The above discussed architecture affords a considerable saving of area in the integrated implementation, due to the use of just low-voltage transistors; a considerable reduction of the current consumption; and a reduction of the complexity and costs of the manufacturing process, due to the reduction of the number of masks and implants required.

SUMMARY

However, the present inventors have realized that the same use of just low voltage transistors requires an overhead time at the beginning and at the end of programming operations, due to the required biasing preparation steps (in particular, for column, or row, selection and successive release). In particular, the present Applicant has realized that this overhead time may become an issue in case a high speed throughput is required for the programming operations.

Given a certain amount of data to be loaded in the memory device, a number of write operations may be done in a sequence of memory locations that are contiguous (a so called memory block), to improve the speed of the programming operations. A fast sequential writing operation may indeed allow to improve a software update time in the field (thus increasing performance) or a personalization phase during manufacturing (thus allowing a cost saving). In case of a sequential writing, individual programming operations should be fast, since many data have to be written sequentially.

The present Applicant has realized that the above discussed overhead time for the decoding operations in the PCM device may decrease the desired throughput, when many memory locations are to be written in a sequence. Therefore, at least in this operating condition, the speed advantage usually associated with PCM memories, with respect to other types of non volatile memories (such as Flash or EEPROM), may be lost.

An object of the present embodiments is consequently to address, at least in part, the problems highlighted previously, to achieve a high throughput during programming operations, in particular sequential writing operations, in a PCM device, having a low-voltage architecture. According to the present embodiments, a system and a method for a phase change non-volatile memory device are provided, as defined below.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF THE PREFERRED EMBODIMENTS

The Applicant has realized that, in a low-voltage decoding architecture as the one previously discussed, overhead time during programming is mainly due to the biasing operations required for column preparation and selection. Accordingly, an aspect of the present approach may include sequential programming of a block of data, in such a manner that a group of addresses, in particular contiguous addresses, are used, that belong to a same column of a memory sector (as previously discussed, composed of a number $N_b$ of bitlines BL); in other words, a single column path is used for sequential writing of a block of data.

A further aspect of the present approach may include separation of the RESET and SET programming operations, that are executed on the wordlines corresponding to the selected group of addresses in distinct and separate consecutive times (first all the RESET, or SET, operations and then all the SET, or RESET, operations). In such a manner, a number of advantages may be achieved in terms of reduction of the programming time, since the overhead time due to column preparation and selection is due only once per block of programmed data, and since the variation of the column biasing conditions between SET and RESET operations (which require substantially different voltage values) is again due only once per block of programmed data.

In particular, a specific sequential loading command may be included, which, when executed, causes the identification of a block of memory cells belonging to a same column of a memory sector, and to respective wordlines having contiguous addresses (it is noted that the contiguous addresses may be either physically or logically contiguous addresses belonging to a same column).

The group of identified memory cells form a programming block, whose size is variable and may be freely defined according to the specific programming need and memory features. The programming block may be defined by a starting address, Add<i>, defining the row starting from which the block is determined, and the respective column.

In this respect, it is known that memory addresses usually define the row and column for an addressed word. For example, considering a memory array sector having 32 rows and 8 columns, a memory address needs 3 bits to decode the column and 5 bits to decode the row, and may thus be in the form add<7:0> (from '0000000' to '1111111'). The three least significant bits may define the column and the five most significant bits the word, so that the address for a word in column 3 and row 5 is for example: '00101011'.

According to an aspect of the present approach, the same address format add<7:0> may be used to define the above discussed programming blocks. For example, considering a block size of 4 words, the two most significant bits of starting address Add<i> may be used to define the block within a desired column: '00', for the first block; '01' for the second block; '11' for the third block; and '11' for the fourth block. For block programming operations, the two most significant bits (for defining the block) and the three least significant bits (for defining the column) will thus define the starting address Add. For example, a starting address '01XXX001' will define the second block of column 1 of the memory array sector.

Figure 4:
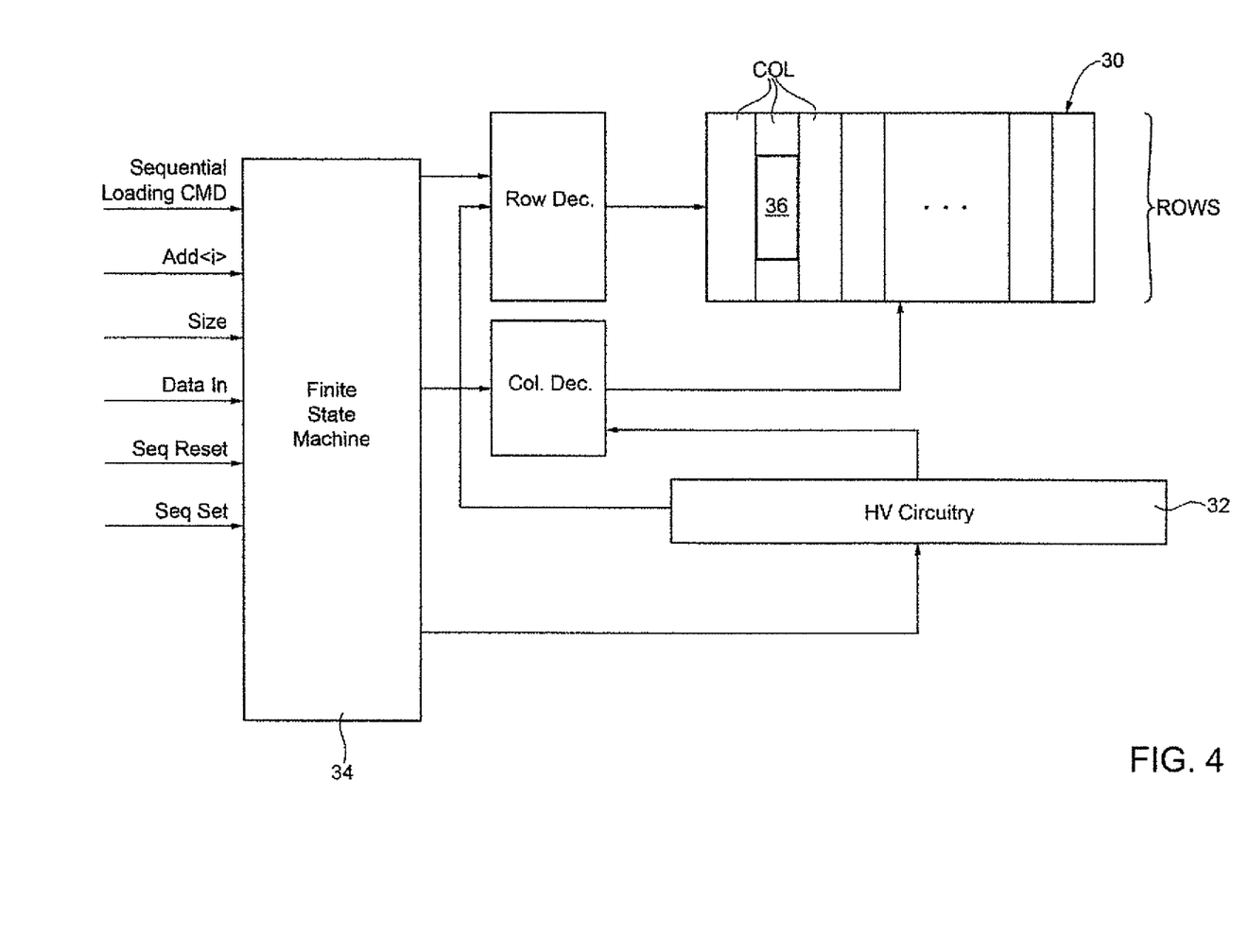
FIG. 4 is a general block diagram of a non-volatile PCM device, according to an aspect of the present approach.

FIG. 4 (where same reference numerals are used to denote similar elements, as in the previous Figures) shows schematically the architecture of a PCM device 1, including a memory array 2 of memory cells 3 (not shown), of which only one sector 30 is shown, including a number of columns and a respective number of words. As previously discussed, PCM device 1 has a low-voltage architecture and includes: a column decoder 4 and a row decoder 5, in particular configured as discussed in detail in connection with FIGS. 1-3 (to which reference is made), operatively coupled to the memory array 2 to perform selection of columns (here denoted with Col) and wordlines WL thereof; and a high-voltage (HV) circuitry 32.

HV circuitry 32 is coupled to column decoder 4 and row decoder 5, and includes circuit elements, such as charge pumps and similar, designed to provide boosted voltage levels and high current values needed for the row and column decoding operations.

According to a particular aspect of the present approach, PCM device 1 further includes a control logic 34, in particular including a Finite State Machine (FSM), coupled to the column decoder 4, the row decoder 5 and the HV circuitry 32. Control logic 34 may receive at input the sequential loading command CMD, the starting address Add<i> and block size, and the data to be written (in the form of data bytes, or words); according to a possible embodiment, these data and commands may be received from a control unit of an electronic apparatus in which the PCM device 1 is used for data storage purposes.

In particular, the block 'size' value represents the number of contiguous wordlines WL where the sequential programming of data is to be performed, variable from a minimum of 1 up to a maximum size, depending on the physical size (and total number of wordlines) of the memory sector 30. Control logic 34 is configured to suitably control the HV circuitry 32, the column decoder 4 and row decoder 5, to perform the biasing, decoding and selection operations for executing the sequential programming of the input data within the memory array 2, in particular within a block 36 of memory cells 3 belonging to a same column (one respective bitline BL for each word bit) and to contiguous wordlines WL.

Figure 5:
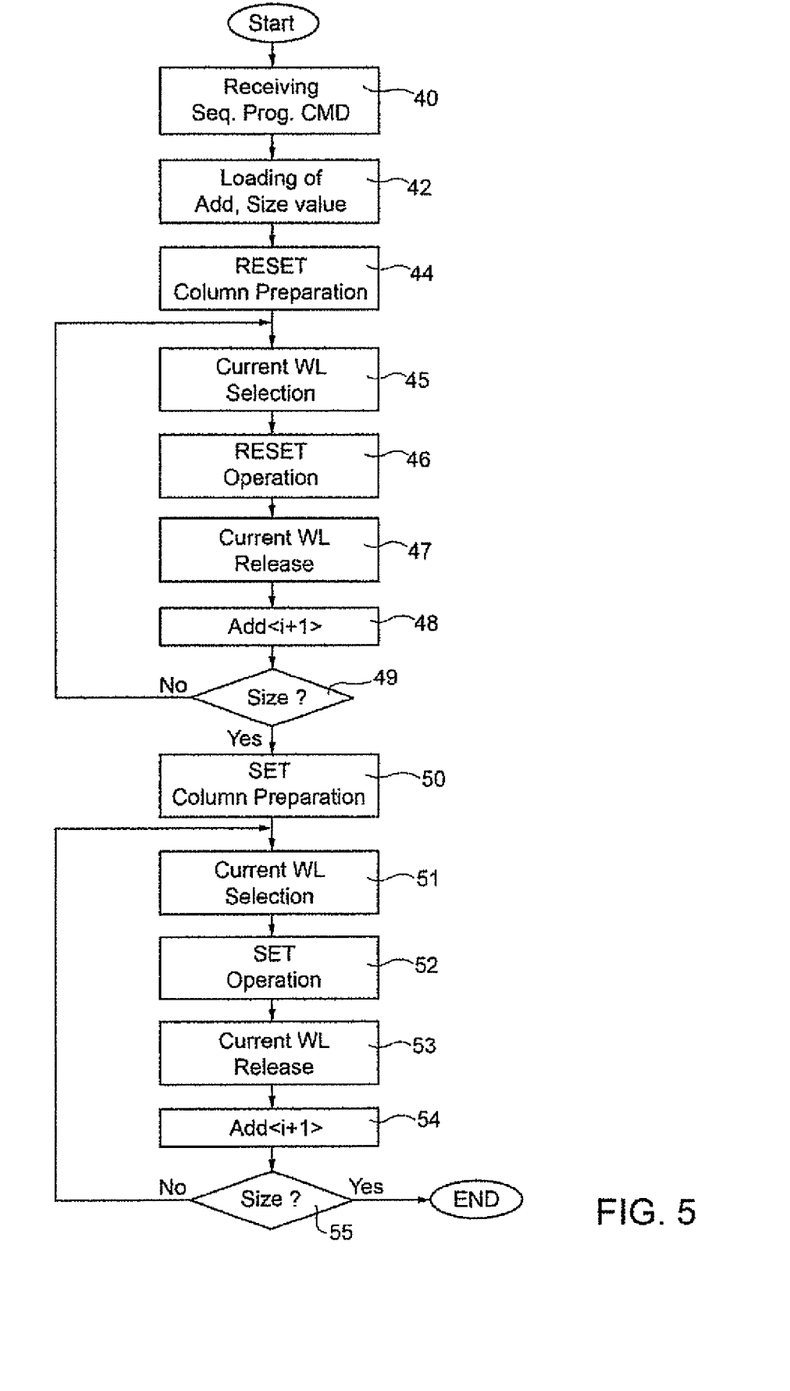
FIG. 5 is a flowchart of programming operations performed in the PCM device of FIG. 4.

In detail, and with reference also to the flowchart of FIG. 5, operations performed by the control logic 34 may include, after receiving of the sequential programming command CMD at step 40, loading of the initial address Add<i> and of the block size value, at step 42.

Afterwards, sequential RESET is performed, which may include execution of RESET programming, in the identified block of the selected column, of all the wordlines, whose memory cells 3 require such operation, based on the data to be written in the memory array 2.

In detail, at step 44, operations are performed for preparation of column decoder 4 for the RESET programming of the selected column (and the respective bitlines EL); these operations may include, as previously discussed and as disclosed in detail in above reference patent application US 2013/0258766 A1, suitable steps of pre-charging of the voltage on the selected main bitline, selection of the local bitlines BL, as well as steps of boosting of the voltage on the control terminals of the protection elements, in cascade configuration, and on the well-biasing terminal of the MOS transistors. As previously discussed, these operations may require an overhead time, due to the biasing voltages to be applied and the charge/discharge times of the HV circuitry 32.

Then, at step 45, operations are performed for selection of a current wordline WL among the wordlines of the selected block, beginning from starting address Add<i>. As previously discussed, these operations do not require a relevant overhead time. RESET operation on the current wordline is then performed, at step 46, in a known manner, here not discussed in detail, so as to cause programming in the RESET state of the memory cells 3 belonging to the selected bitlines and the current wordline.

The current wordline is released, at a successive step 47, modifying the biasing conditions applied thereto, again in a known manner, here not discussed in detail. The address is then incremented (as schematically denoted with Add<i+1>), at step 48, in view of the programming of a consecutive wordline WL in the selected block 36. Steps from 45 to 48 are then iteratively repeated, until the last wordline WL in the selected block 36 (requiring RESET programming) is programmed (step 49).

Afterwards, sequential SET is performed, which may include execution of SET programming of all the wordlines in the identified block, whose memory cells 3 require such operation, based on the data to be written in the memory array 2. In detail, at step 50, operations are performed for preparation of column decoder 4 for the SET programming of the selected column (and respective bitlines BL); these operations include a suitable variation of the biasing conditions, to take into account the different biasing values required for the SET operations.

Then, at step 51, operations are performed for selection of a current wordline WL among the wordlines of the selected block, again beginning from the starting address Add<i>. SET operation on the current wordline is then performed, at step 52, in a known manner, here not discussed in detail, and then the same wordline is released, at a successive step 53.

Afterwards, the address is incremented (Add<i+1>), at step 54, in view of the programming of a consecutive row in the selected block. Steps from 51 to 54 are then iteratively repeated, until the last wordline WL in the selected block (requiring SET programming) is loaded (step 55).

After the last SET operation is performed, sequential loading of the block of data is terminated, and operation of the PCM device 1 may resume with further writing or reading operations, in a usual manner, eventually with further sequential loading operations, to be performed on different blocks of the memory array 2.

The advantages of the discussed approach are clear from the foregoing description.

In any case, it is once again emphasized that it allows the advantageous features associated with the use of only low voltage transistors in the memory decoding architecture (such as the saving of area in integrated implementation, the reduction of energy consumption, and the saving in the corresponding costs and complexity of the manufacturing process), while not sacrificing the programming speed, in particular in case of sequential loading of the memory.

In particular, tests performed by the inventors have shown that the disclosed approach allows the PCM device 1 to retain a speed advantage over other types of non-volatile memories (such as EEPROM and Flash memories), during sequential writing of memory blocks, as shown in the following Table 2.

TABLE 2

| Size | Loading time ePCM | Loading time EEPROM | Loading time Flash |
|---|---|---|---|
| 64 bit | 0.5 ms | 3 ms | 2.4 ms |
| 128 bit | 1 ms | 3 ms | 3.5 ms |
| 256 bit | 2 ms | 3 ms | 4.8 ms |

The above data are in regards to a memory with a sector organization with 512 rows, 4 bytes per word, a maximum size of 512 and low consumption performance.

Moreover, the discussed approach allows more flexibility to be achieved in the size of the memory blocks to be sequentially loaded, since any size for programming (from a minimum size to a maximum size of the block) may be chosen, according to desired needs and operation requirements. In this regard, it is underlined that block size is instead usually fixed at the design stage, and not variable, in current non volatile memories solutions, with so called "page organization".

Moreover, the discussed approach does not require relevant structural modification of the memory architecture; introduction of control logic 34 does not entail relevant additional costs, in particular in case it is implemented with a finite state machine (although other implementations are possible, such as including use of a processor, an FPGA, or similar computing unit). In general, all the advantages set forth render the use of non-volatile PCMs more competitive in terms of performance, manufacturing and operating costs.

Finally, it is clear that modifications and variations may be made to what is described and illustrated herein, without thereby departing from the scope of the present embodiments.

In particular, possible alternative embodiments of the present approach may include a sequential SET command or sequential RESET command, instead of, or in addition to, a sequential programming command, in the cases in which only SET or only RESET operations are to be performed, in a sequential manner, in a memory block.

Moreover, it is evident that the phase change non-volatile memory device described may have a wide range of applications, for example, in microcontrollers, in applications with high safety requirements using smart cards with contact interface (such as PAY TV systems, SIMs, TPM modules) that must satisfy the ETSI consumption specifications, and in contactless smart-card applications (RFIDs, NFCs, bank credit cards, etc.), where the memory module has a current budget limited by energy harvesting system (recovery of energy from the carrier) for all the operations (both writing operations and reading operations).

Figure 6:
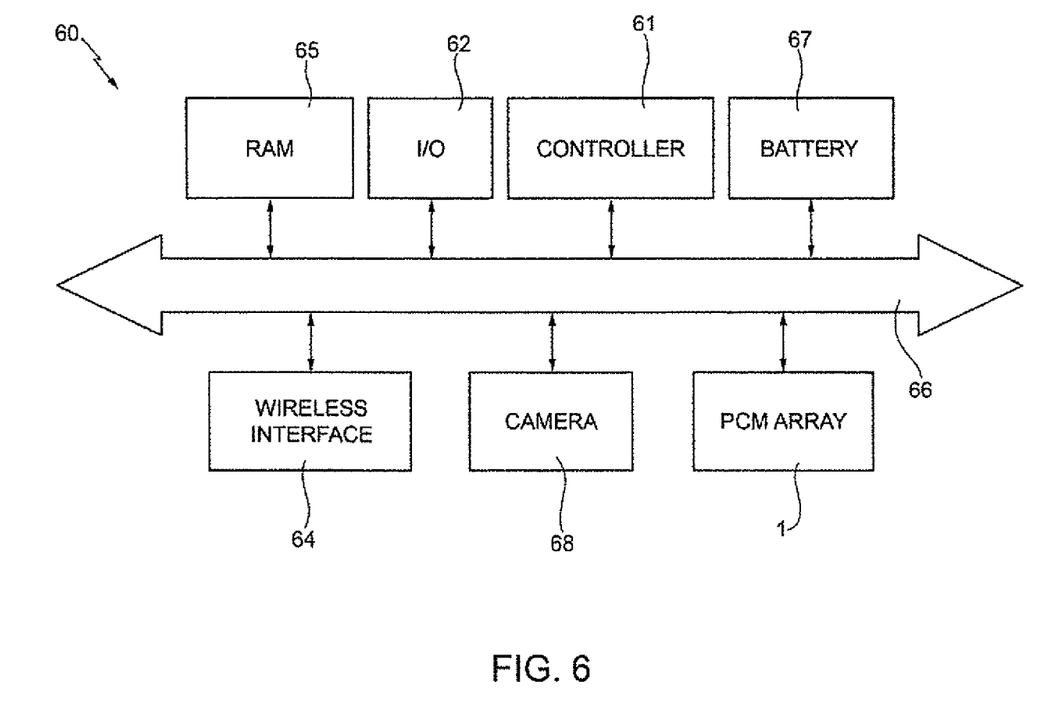
FIG. 6 is a schematic block diagram of an electronic apparatus incorporating the PCM memory device of FIG. 4.

In this respect, FIG. 6 shows a portion of an electronic apparatus 60, according to a further embodiment of the present embodiments. The electronic apparatus 60 may be for example: a PDA (Personal Digital Assistant); a portable or fixed computer, possibly with wireless data-transfer capacity; a mobile phone; a digital audio player; a photographic camera or a camcorder; or further devices able to process, store, transmit and receive information.

In detail, the electronic apparatus 60 comprises: a controller 61 (for example, provided with a microprocessor, a DSP, or a microcontroller); an input/output device 62 (for example, provided with a keypad and a display), for input and display of data; the PCM device 1, provided with the array 2 of memory cells 3 of the phase-change type, previously described; a wireless interface 64, for example, an antenna, for transmitting and receiving data through a radiofrequency wireless communication network; and a RAM 65, all coupled through a bus 66. A battery 67 may be used as electrical-supply source in the electronic apparatus 60, which can further be provided with a photographic or video camera or camcorder 68.

In particular, controller 61 may provide control logic 34 of PCM device 1 with the sequential loading command, and related starting address Add, size and data to be loaded, according to operation requirements of the electronic apparatus 60.

The invention claimed is:

1. A phase change non-volatile memory device comprising:
   a memory array with a plurality of memory cells including phase change material and arranged in rows and columns;
   a column decoder and a row decoder configured to select columns, and, respectively, rows of the memory array during operations of programming of corresponding memory cells; and control logic, coupled to the column decoder and the row decoder, and configured to execute a sequential programming command to control the column decoder and row decoder to select one column of the memory array and execute sequential programming operations on a selected block of memory cells belonging to a number of contiguous selected rows of the selected column, wherein the control logic is configured to define the selected block based on a variable block size value corresponding to the number of contiguous selected rows.

2. The memory device according to claim 1, wherein the control logic is configured to define the contiguous selected rows based on a starting address, wherein the contiguous selected rows are physically or logically consecutive rows of the memory array beginning from the starting address.

3. The memory device according to claim 1, wherein the sequential programming operations controlled by the control logic result in sequential programming operations of a first type, between SET and RESET programming, on memory cells of the selected rows, followed by sequential programming operations of a second type, between SET and RESET programming, different from the first type, on memory cells of the selected rows.

4. The memory device according to claim 3, wherein the control logic is configured to: cause a variation of biasing conditions associated with the column decoder for programming of the block of memory cells, after the programming operation of the first type and before the programming operation of the second type.

5. The memory device according to claim 3, wherein the sequential programming operations of at least one of the first and second type include at least one of iterative RESET and SET programming of the current rows, each time selected, up to the size of the block of memory cells to be programmed.

6. The memory device according to claim 1, wherein the control logic is configured to: receive at input the sequential loading command, a starting address and a size of the block of memory cells; and identify a column of the memory array having a block of memory cells with the desired size, where the sequential programming operations are to be performed.

7. The memory device according to claim 1, wherein the control logic is configured to receive input data to be programmed in the block of memory cells, and to execute the sequential programming command, based on the input data.

8. The memory device according to claim 1, wherein the control logic comprises a Finite State Machine.

9. The memory device according to claim 1, wherein the column decoder includes:
a plurality of selection switches arranged on a number of hierarchical decoding levels and selectively operable in cascaded fashion so as to define a conductive path between the selected column and a driving stage, which supplies biasing quantities; and
protection elements set between respective bitlines of the memory array and respective selection switches;
wherein the selection switches and the protection elements include low-voltage MOS transistors, having a maximum sustainable voltage level lower than a desired programming voltage value, and the protection elements are biased so as to prevent occurrence, between terminals of the MOS transistors of the selection switches, of voltages higher than the maximum sustainable level during the programming operations.

10. A method for programming a phase change non-volatile memory device comprising a memory array with a plurality of memory cells including phase change material, arranged in rows and columns, a column decoder and a row decoder configured to select columns, and, respectively, rows of the memory array during operations of programming of corresponding memory cells, the method comprising:
receiving a sequential programming command;
controlling, by using a control circuit, the column decoder and row decoder to select one column of the memory array and to execute sequential programming operations on a selected block of memory cells belonging to a number of contiguous selected rows of the selected column; and
defining, by using the control circuit, the selected block based on a variable block size value corresponding to the number of contiguous selected rows.

11. The method according to claim 10, including defining the contiguous selected rows, based on a starting address, as consecutive rows of the memory array beginning from the starting address.

12. The method according to claim 10, wherein controlling includes controlling the column decoder and row decoder to execute sequential programming operations of a first type, between SET and RESET programming, on memory cells of the selected rows, followed by sequential programming operations of a second type, between SET and RESET programming, different from the first type, on memory cells of the selected rows.

13. The method according to claim 12, including causing a variation of biasing conditions associated with the column decoder for programming of the block of memory cells, after the programming operation of the first type and before the programming operation of the second type.

14. As electronic device comprising:
an input/output device;
a phase change non-volatile memory device coupled to the input/output device comprising
a memory array with a plurality of memory cells including phase change material and arranged in rows and columns,
a column decoder and a row decoder configured to select columns, and, respectively, rows of the memory array during operations of programming of corresponding memory cells, and
control logic, coupled to the column decoder and the row decoder, and configured to execute a sequential programming command to control the column decoder and row decoder to select one column of the memory array and execute sequential programming operations on a selected block of memory cells belonging to a number of contiguous selected rows of the selected column, and
a controller coupled to the input/output device and the phase change non-volatile memory device, and configured to provide the sequential programming command to the control logic of the phase change non-volatile memory device, wherein the control logic is configured to define the selected block based on a variable block size value corresponding to the number of contiguous selected rows.

15. The electronic device according to claim 14, wherein the control logic is configured to define the contiguous selected rows based on a starting address, wherein the contiguous selected rows are physically or logically consecutive rows of the memory array beginning from the starting address.

16. The electronic device according to claim 14, wherein the sequential programming operations controlled by the control logic result in sequential programming operations of a first type, between SET and RESET programming, on memory cells of the selected rows, followed by sequential programming operations of a second type, between SET and RESET programming, different from the first type, on memory cells of the selected rows.

17. The electronic device according to claim 16, wherein the control logic is configured to cause a variation of biasing conditions associated with the column decoder for programming of the block of memory cells, after the programming operation of the first type and before the programming operation of the second type.

18. The electronic device according to claim 14, wherein the controller is configured to provide the control logic with the sequential loading command, a starting address and a size of the block of memory cells; and the control logic is configured to identify a column of the memory array having a block of memory cells with the desired size, where the sequential programming operations are to be performed.

19. The electronic device according to claim 14, wherein the controller is configured to provide the control logic with input data to be programmed in the block of memory cells; and the control logic is configured to execute the sequential programming command, based on the input data.

20. A phase change non-volatile memory device comprising:
a memory array with a plurality of memory cells including phase change material and arranged in rows and columns;
a column decoder and a row decoder configured to select columns, and, respectively, rows of the memory array during operations of programming of corresponding memory cells; and
control logic, coupled to the column decoder and the row decoder, and configured to execute a sequential programming command to control the column decoder and row decoder to select one column of the memory array and execute sequential programming operations on a selected block of memory cells belonging to contiguous selected rows of the selected column, wherein the sequential programming operations controlled by the control logic result in sequential programming operations of a first type among SET and RESET programming on memory cells of the contiguous selected rows, followed by sequential programming operations of a second type among SET and RESET programming, different from the first type, on memory cells of the contiguous selected rows.

21. The memory device according to claim 20 wherein the control logic is configured to define the contiguous selected rows based on a starting address, wherein the contiguous selected rows are physically or logically consecutive rows of the memory array beginning from the starting address.

22. The memory device according to claim 20, wherein the control logic is configured to: cause a variation of biasing conditions associated with the column decoder for programming of the block of memory cells, after the programming operation of the first type and before the programming operation of the second type.

23. The memory device according to claim 20, wherein the sequential programming operations of at least one of the first and second type include at least one of iterative RESET and SET programming of the current rows, each time selected, up to the size of the block of memory cells to be programmed.

24. A phase-change non-volatile memory device comprising:
a memory array with a plurality of memory cells including phase change material and arranged in rows and columns;
a column decoder and a row decoder configured to select columns, and, respectively, rows of the memory array during operations of programming of corresponding memory cells; and
control logic, coupled to the column decoder and the row decoder, and configured to execute a sequential programming command to control the column decoder and row decoder to select one column of the memory array and execute sequential programming operations on a selected block of memory cells belonging to contiguous selected rows of the selected column, wherein the control logic is configured to receive input data to be programmed in the block of memory cells, and to execute the sequential programming command, based on the input data.

25. The memory device according to claim 24 wherein the control logic is configured to:
receive at input the sequential loading command, a starting address and a desired size of the block of memory cells; and identify a column of the memory array having a block of memory cells with the desired size, where the sequential programming operations are to be performed.

26. The memory device according to claim 24, wherein the control logic comprises a Finite State Machine.

* * * * *

UNITED STATES PATENT AND TRADEMARK OFFICE
CERTIFICATE OF CORRECTION

PATENT NO. : 9,697,896 B2  
APPLICATION NO. : 14/623300  
DATED : July 4, 2017  
INVENTOR(S) : Antonino Conte Page 1 of 1

It is certified that error appears in the above-identified patent and that said Letters Patent is hereby corrected as shown below:

On the Title Page

Item (72) Inventors, Line 1, delete "Tremestiere" and insert --Tremestieri--.

In the Claims

In Column 14, Line 37, Claim 14, delete "As" and insert --An--.

Signed and Sealed this  
Twenty-fourth Day of October, 2017

Joseph Matal  
*Performing the Functions and Duties of the*  
*Under Secretary of Commerce for Intellectual Property and*  
*Director of the United States Patent and Trademark Office*